US010340437B2

(12) United States Patent
Cauchon et al.

(10) Patent No.: US 10,340,437 B2
(45) Date of Patent: *Jul. 2, 2019

(54) THERMOELECTRIC DEVICES

(71) Applicant: Xilico, LLC, Thousand Oaks, CA (US)

(72) Inventors: Greg P. Cauchon, Thousand Oaks, CA (US); Ian D. McFadden, Thousand Oaks, CA (US); Samir Sachdev, Thousand Oaks, CA (US)

(73) Assignee: XILICO, LLC, Thousand Oaks, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/882,801

(22) Filed: Jan. 29, 2018

(65) Prior Publication Data

US 2018/0159016 A1    Jun. 7, 2018

Related U.S. Application Data

(63) Continuation of application No. 15/181,298, filed on Jun. 13, 2016, now Pat. No. 9,882,111.

(60) Provisional application No. 62/174,968, filed on Jun. 12, 2015.

(51) Int. Cl.
| | |
|---|---|
| H01L 21/70 | (2006.01) |
| H01L 35/34 | (2006.01) |
| H01L 35/32 | (2006.01) |
| B33Y 80/00 | (2015.01) |
| B33Y 10/00 | (2015.01) |

(52) U.S. Cl.
CPC .............. *H01L 35/34* (2013.01); *H01L 35/32* (2013.01); *B33Y 10/00* (2014.12); *B33Y 80/00* (2014.12)

(58) Field of Classification Search
None
See application file for complete search history.

(56) References Cited

U.S. PATENT DOCUMENTS

| | | | |
|---|---|---|---|
| 7,431,965 B2 | 10/2008 | Grigorian et al. | |
| 9,882,111 B2* | 1/2018 | Cauchon | H01L 35/32 |
| 2007/0289620 A1* | 12/2007 | Stark | H01L 35/32 |
| | | | 136/205 |
| 2009/0072385 A1* | 3/2009 | Alley | H01L 23/38 |
| | | | 257/713 |
| 2016/0190371 A1* | 6/2016 | Sorloaica-Hickman | |
| | | | H01L 31/0547 |
| | | | 136/246 |
| 2016/0209744 A1* | 7/2016 | Shindo | G03F 7/0233 |

FOREIGN PATENT DOCUMENTS

| | | | |
|---|---|---|---|
| GB | 1292387 | | 10/1972 |
| GB | 1292387 A | * | 10/1972 ........... C01B 19/002 |

OTHER PUBLICATIONS

Marcos Nunes Dos Santos et al., Nanocomposite of Photocurable Epoxy-acrylate Resin and Carbon Nanotubes: Dynamic-mechanical, Thermal and Tribological Properties, Materials Research, 2013, 367-374.
M. S. Dresselhaus et al., Defect Characterization in Graphene and Carbon Nanotubes using Raman Spectroscopy, Philosophical Transactions of the Royal Society, Mathematical Physical and Engineering Sciences, 2010, 5354-5377.
Andrea C. Ferrari, Raman spectroscopy of graphene and graphite: Disorder, electron-phonon coupling, doping and nonadiabatic effects, ScienceDirect, Solid Slate Communications, 2007, 47-57, vol. 143, Cambridge University Engineering Department, Cambridge, UK.
G. L. Hornyak et al., A Temperature Window for Chemical Vapor Decomposition Growth of Single-Wall Carbon Nanotubes, J. Phys. Chem. B, 2002, 2821-2825, National Renewable Energy Laboratory, Golden, Colorado.
Mukul Kumar et al., Chemical Vapor Deposition of Carbon Nanotubes: A Review on Growth Mechanism and Mass Production, Journal of Nanoscience and Nanotechnology, 2010, 3739-3758, vol. 10, American Scientific Publishers, Nagoya, Japan.
M. Martin-Gallego et al., Cationic photocured epoxy nanocomposites filled with different carbon fillers, Polymer 53, 2012, 1831-1838.
Marco Sangermano et al., Use of Single-Walled Carbon Nanotubes as Reinforcing Fillers in UV-Curable Epoxy Systems, Macromolecular Materials and Engineering, 2008, 708-713.
Shota Ushiba et al., 3D microfabrication of single-wall carbon nanotube/polymer composites by two-photon polymerization lithography, Carbon, 2013, 283-288, 59.
Yue-Feng Zhu et al., Alignment of multiwalled carbon nanotubes in bulk epoxy composites via electric field, Journal of Applied Physics, 2009, 054319-1-054319-6, 105.
Marcos N. Dos Santos, Thermal and mechanical properties of a nanocomposite of a photocurable epoxy-acrylate resin and multiwalled carbon nanotubes, Materials Science and Engineering A, 2011, 4318-4324, 528.
B. Dong et al., Study on tribological properties of multi-walled carbon nanotubes/epoxy resin nanocomposites, Tribology Letters, 2005, 251-254, vol. 20, Lanzhou, China.
F.H. Gojny et al., Carbon nanotube-reinforced epoxy-composites: enhanced stiffness and fracture toughness at low nanotube content, Composites Science and Technology, 2004, 2363-2371, 64.
Peng Sheng et al., A Novel Cuprous Ethylenetetrathiolate Coordination Polymer: Structure Characterization, Thermoelectric Property Optimization and a Bulk Thermogenerator Demonstration, Synthetic Metals, 2014, 1-7,193, Beijing, China.
G. Jeffrey Snyder et al., Complex Thermoelectric Materials, Nature Publishing Group, 2008, 105-114, 7.

\* cited by examiner

*Primary Examiner* — Calvin Y Choi
(74) *Attorney, Agent, or Firm* — Cislo & Thomas, LLP

(57) ABSTRACT

This disclosure relates to methods for manufacturing devices capable of functioning as thermoelectric generators and related objects by the process of additive manufacturing or by 3-D printing or by casting. This disclosure also particularly relates to the uses of the thermoelectric generators and related objects produced by these methods.

18 Claims, 9 Drawing Sheets

THERMOELECTRIC DEVICES

CROSS-REFERENCE TO RELATED APPLICATION

This patent application is a continuation of U.S. patent application Ser. No. 15/181,298, filed Jun. 13, 2016, which claims the benefit of U.S. Provisional Patent Application Ser. No. 62/174,968, entitled "Thermoelectric Devices," filed Jun. 12, 2015, which applications are incorporated in their entirety here by this reference.

BACKGROUND

Technical Field

This disclosure relates to the field of additive manufacturing. This disclosure also relates to the field of 3-D printing. This disclosure particularly relates to the fabrication of thermoelectric devices, such as thermoelectric generators. This disclosure also relates to methods for employing additive-manufacturing systems and/or devices for producing useful materials and/or objects, including thermoelectric devices, such as thermoelectric generators.

Description of Related Art

There is currently considerable research and development effort being directed at the development of devices which are capable of generating electricity from low-level or waste energy sources. Among these devices, which are sometimes known as thermoelectric generators, are models in which a modest temperature difference can be used to generate an electric current. Such devices rely on the incorporation of special substances, called thermoelectric materials, which can generate electricity from low-level temperature differences. These types of devices can be used to generate power in a wide variety of applications, and are expected to play a significant role in addressing the global energy crisis.

In addition to the challenge of developing efficient and cost-effective thermoelectric materials, another impediment to the widespread applicability of thermoelectric generators is the cost and complexity of assembling useful devices which incorporate them. Most such devices are currently assembled by hand using a variety of different materials, which not only makes them cost-prohibitive but also introduces unnecessary complication, lowers reliability and reproducibility, and degrades their performance. Clearly, better fabrication methods are needed to facilitate the widespread acceptance of thermoelectric generators.

Additive manufacturing refers to a family of technologies for building three-dimensional (3-D) solid or partially-solid objects by sequentially or simultaneously depositing layers of materials according to a design produced using a computer-aided design (CAD) software application. The family of additive manufacturing (AM) techniques has proven useful for the rapid production of complex prototypes as well as the manufacture of complex and complicated objects, and is especially well-suited to fabricating complicated objects in a rapid and cost-effective manner.

Additive manufacturing can be used to create highly-customized complex parts and products that are difficult or impossible to manufacture using traditional technologies. This technology can also be used to rapidly create prototype objects which could take much longer to produce by other means. This technology can also be used to create objects at a lower cost than they could be produced using other means.

One especially useful form of additive manufacturing is known as 3-D printing. In 3-D printing, multiple layers of material (referred to generally as the 'build material') are laid down successively to produce a three-dimensional object.

There are several major 3-D printing technologies differing mainly in the way successive layers are built to create the final 3-D object. Some methods use melting or softening and deposition of the build material to produce the layers of the growing object. For example, fused-deposition modeling (FDM) works by extruding melted plastic or metal, often supplied in the form of filaments or wires, through an extrusion nozzle to form the successive layers. On the other hand, selective laser sintering (SLS) works by laying down a thin layer of powdered metal, plastic, ceramic, or glass and then sintering the intended cross-sectional area of each layer to produce the desired object. Powder printing works similarly, except that the layers of powdered materials which are laid down are then printed over using a technology such as an ink-jet printer to create the cross-sectional image of the desired object. Stereolithography (or stereolithographic assembly, SLA) is based on photocuring (polymerizing) liquid materials such as polymer resins by applying external energy sources such as ultraviolet (UV) or visible light or electron-beam irradiation to produce each successive layer of a solid object. Each of these additive manufacturing techniques has important applications in the fields of prototyping and manufacturing.

Two relevant publications which detail current research efforts on thermoelectric materials and thermoelectric generators include G. J. Snyder and E. Toberer, Nature Materials 7, 105 (2008) and P. Sheng, Y. Sun, F. Jiao, C. Di, W. Xu, and D. Zhu, Synthetic Metals 193, 1-7 (2014). The entire content of these publications is incorporated herein by reference.

The illustration in FIG. 1 is taken from FIG. B1 in G. J. Snyder and E. Toberer, Nature Materials 7, 105 (2008), and shows a schematic representation of a thermoelectric generator. The outer, non-electrically conducting substrates 10a, 10b are shown in gray, these are typically made from materials such as poly(dimethylsiloxane) (PDMS) or a poly (imide) such as Kapton®, which are familiar commercial materials to those skilled in the art. A series of thermoelectric elements 12a, 12b, or legs, is represented as vertical members with square cross sections. A series of metal interconnects 14a provides thermal connections between pairs of legs at the top of the generator, while another set of metal interconnects 14b provides electrical connections between pairs of legs at the bottom of the generator. These connections alternate, so that the thermal connections occur between different legs than do the electrical connections. The flow of electrical current is thus up through an n-type leg, across the thermal connector, down through an p-type leg, across the electrical connector, and then up again through the next n-type leg, and so on until it reaches the distal terminal and exits the thermoelectric generator.

Although additive manufacturing would appear to provide an excellent process for both prototyping and manufacturing thermoelectric generators, three major impediments have thus far hindered this approach. First, thermoelectric generators are generally constructed from a heterogeneous set of materials, including polymers, carbon forms, metals, plastics, and other materials, which generally cannot be 3-D printed using any one 3-D printer. Thus, the assembly of thermoelectric generators has been restricted to manual methods. The other impediment has been that it has not been possible to 3-D print the types of thermally- and electrically-conducting materials which are required for the construction of efficient thermoelectric generators. Such materials have demanding properties which require very specific operational parameters, and have thus far proven impossible to 3-D print. The third impediment is specific to stereolithographic assembly (SLA), a preferred method of 3-D printing due to its many advantageous features. A drawback of SLA, however, is that it is generally restricted to a single material. That is, only one type of material can be 3-D printed at a time. Overcoming these three impediments would be expected to lead to the capability to mass-produce thermoelectric generators for a wide variety of applications. This capability, in turn, would enable a wide array or new and novel products with potential applications in home heating, automotive power, industrial generation, aerospace operations, marine environments, and widely-distributed power generation, among many other applications. The electricity generated by these devices could be used to power electronic devices such as energy-storage devices, communications devices, medical devices, ballistic monitors, aircraft and aerospace vehicles, as well as numerous other items.

Thus, the ability to combine efficient thermoelectric materials with a more-efficient and manufacturable design, reduced numbers of materials, and a practical electrically-conducting 3-D printing process would enable a large family of new and novel thermoelectric generators with applicability to a wide variety of fields and industries.

SUMMARY

This disclosure relates to the field of electrical power generation. This disclosure also relates to the field of additive manufacturing or 3-D printing. This disclosure also relates to the field of thermoelectric generators.

Surprisingly, the foregoing challenges can be solved by re-designing the thermoelectric generator and/or increasing its symmetry to permit the fabrication of fewer distinct parts, as well as eliminating some of the materials of construction and developing novel methods for the 3-D printing and assembly of the electrically- and thermally-conductive components of the devices. Together, these improvements make possible the rapid, facile, and inexpensive fabrication of thermoelectric generators and related devices.

In the present invention, the thermoelectric generator is redesigned so that all of the p-type legs and all of the n-type legs are each 3-D printed as a separate, single, and nearly-identical component.

In the present invention, the metal interconnect pieces are replaced by the same 3-D printable material used to print the legs. Thus, the n-type leg structure has n-type interconnect pieces, and the p-type leg structure hasp-type interconnects.

In the present invention, the metal interconnect pieces can also be replaced by an undoped electrically-conducting material which is neither n-type nor p-type but which can nonetheless conduct electricity between the n-type and p-type legs.

The n-type and p-type dopants may be selected from a wide variety of materials well-known to those skilled in the art.

Although the n-type and p-type materials sometimes show reduced electrical conductivity as compared to undoped materials, their conductivity must necessarily be sufficient for the operation of the thermoelectric generator because the power which is generated by the device already flows through each of the p-type and n-type legs.

In addition to reducing the materials requirements and simplifying the 3-D printing process, fabricating the interconnect pieces from the same material as is used to fabricate the n-type and p-type legs provides the additional advantage of eliminating any contact resistance which may be observed between the dissimilar materials of the legs and the interconnect pieces. This results in improved electrical conductivity throughout the device and acts to attenuate any conductivity losses resulting from the reduced conductivity of the non-metallic interconnects.

The 3-D printing process can be carried out onto any of a number of substrates, illustrated in FIG. 1 in gray, which can therefore be chosen for their particular mechanical, thermal, or electrical properties.

The orientation of the 3-D printing process can be adjusted to optimize the properties of the final 3-D printed components. As one example, 3-D printing the individual n-type and p-type components at an angle which is 90° to the plane of the substrate will orient the individual 3-D printed layers (laminae) along the long axis of the legs, facilitating electrical flow through them and further reducing contact resistance with the interconnects.

In addition to 3-D SLA printing, this disclosure anticipates that the present components and devices can also be fabricated using any other additive manufacturing method, including but not limited to powder printing, FDM, SLS, inkjet or multijet techniques, or any other such additive manufacturing technique which is known to those skilled in the art.

The simplicity of the n-type and p-type components in the present disclosure further means that in addition to being fabricated by additive manufacturing methods, they can also simply be cast as single objects. For example, the n-type and p-type materials can each be separately placed into a mold or similar form and irradiated to produce the respective n-type and p-type components. This method of fabrication can lead to even greater manufacturing speeds and lowered manufacturing costs.

These, as well as other components, steps, features, objects, benefits, and advantages, will now become clear from a review of the following detailed description of illustrative embodiments, the accompanying drawings, and the exemplary features.

BRIEF DESCRIPTION OF DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

DETAILED DESCRIPTION OF ILLUSTRATIVE EMBODIMENTS

Figure 1:
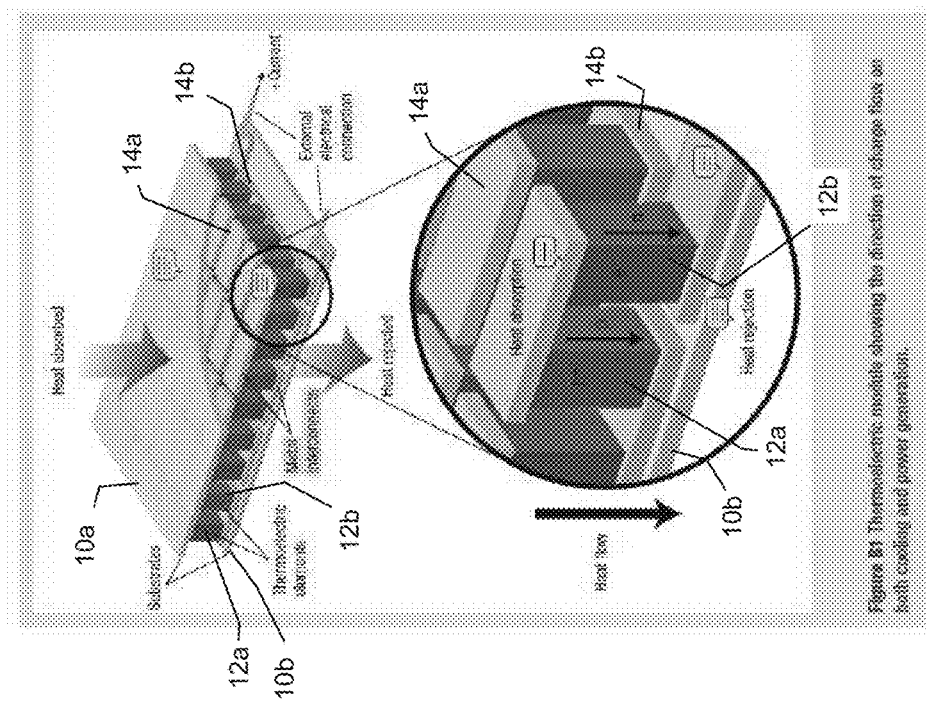
FIG. 1 is a schematic illustration of a thermoelectric generator taken from FIG. B1 in G. J. Snyder and E. Toberer, Nature Materials 7, 105 (2008). This generator contains a 9×6 matrix of square cross-sectional thermoelectric elements, or legs, for a total of 54 legs.
Figure 2:
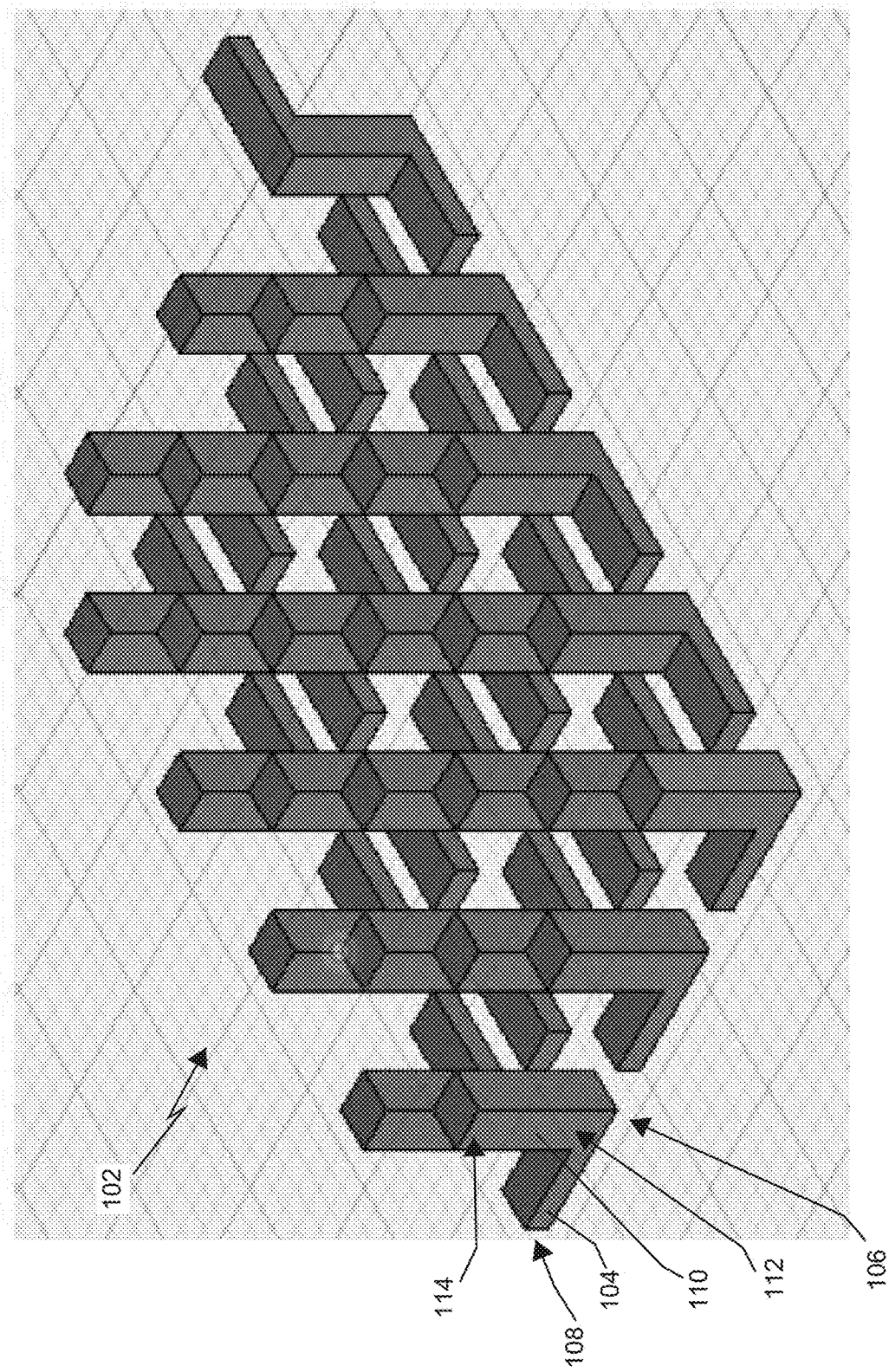
FIG. 2 is an embodiment of a single n-type leg structure. This figure shows the array of n-type legs which is 3-D printed onto a substrate using the n-type doped material. In this example, the bottom rectangular boxes (the interconnects) are 2×2×1 mm and the vertical blocks which are attached to them (the thermoelectric elements or legs) are 2×2×5 mm.
Figure 3:
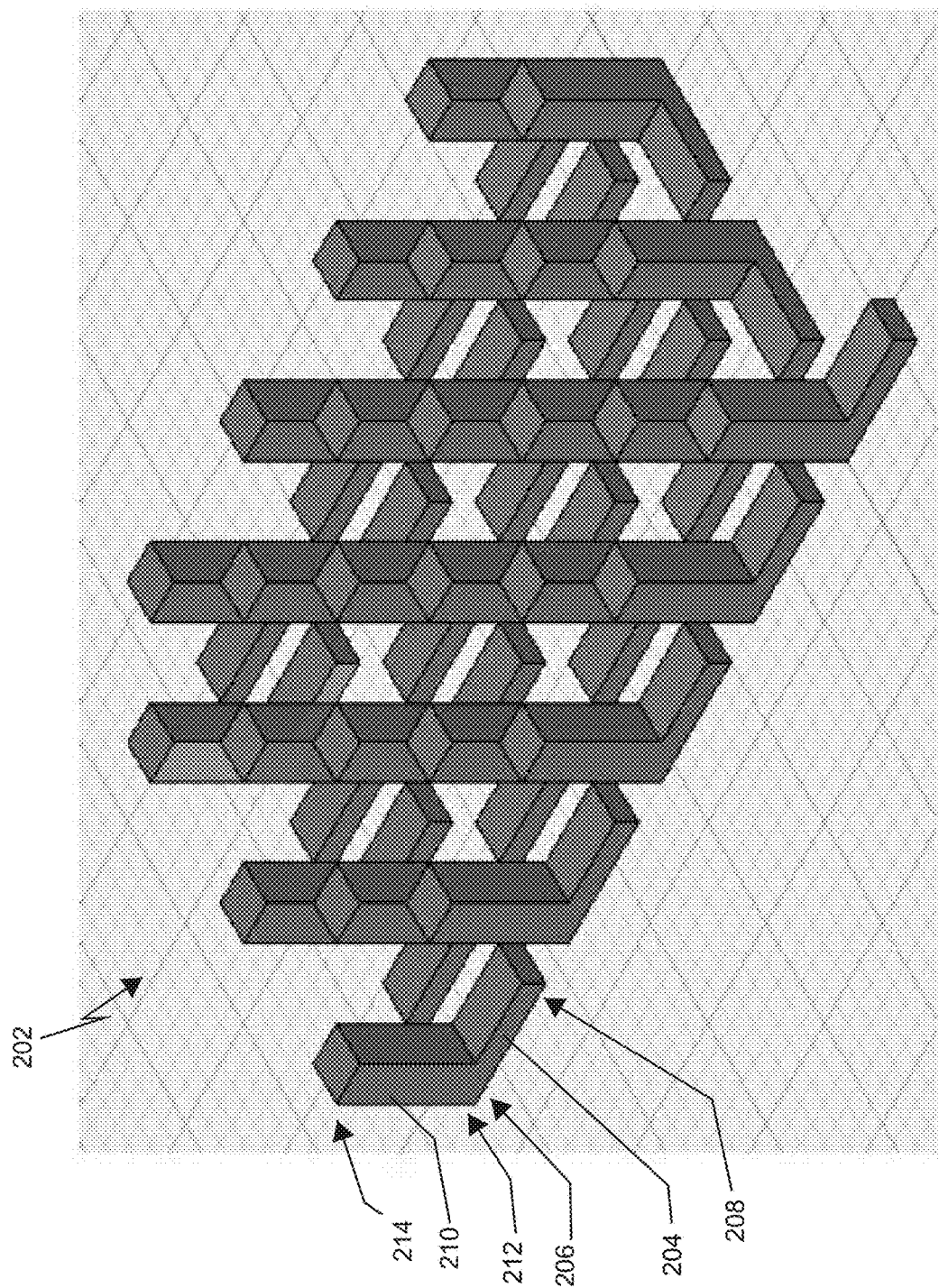
FIG. 3 is an embodiment of a single p-type leg structure. This figure shows the array of p-type legs which is 3-D printed onto a substrate using the p-type doped material. In this example, the bottom rectangular boxes (the interconnects) are 2×2×1 mm and the vertical blocks which are attached to them (the thermoelectric elements or legs) are 2×2×5 mm.
Figure 4:
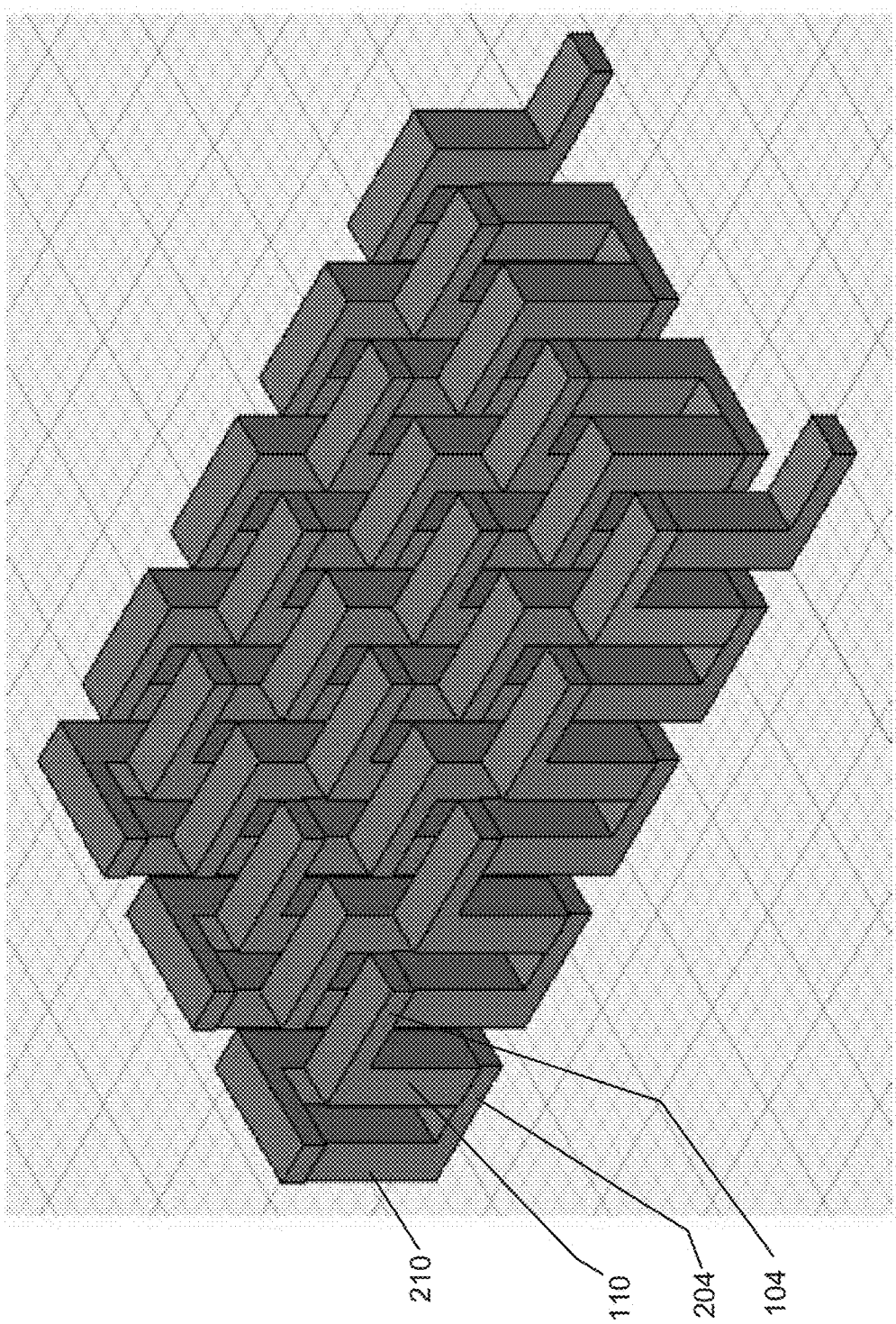
FIG. 4 is a drawing of an embodiment of an assembled 3-D printable thermoelectric generator. This figure shows how the components in FIGS. 2 and 3 are assembled to obtain an intact device in which the current flows in series row by row. The current flows by going down one row to the end, after which it moves to the next row by a connector and then flows down the next row in the opposite direction. The electrical current then continues flowing in this pattern until it reaches the terminal contact at the other end.
Figure 5:
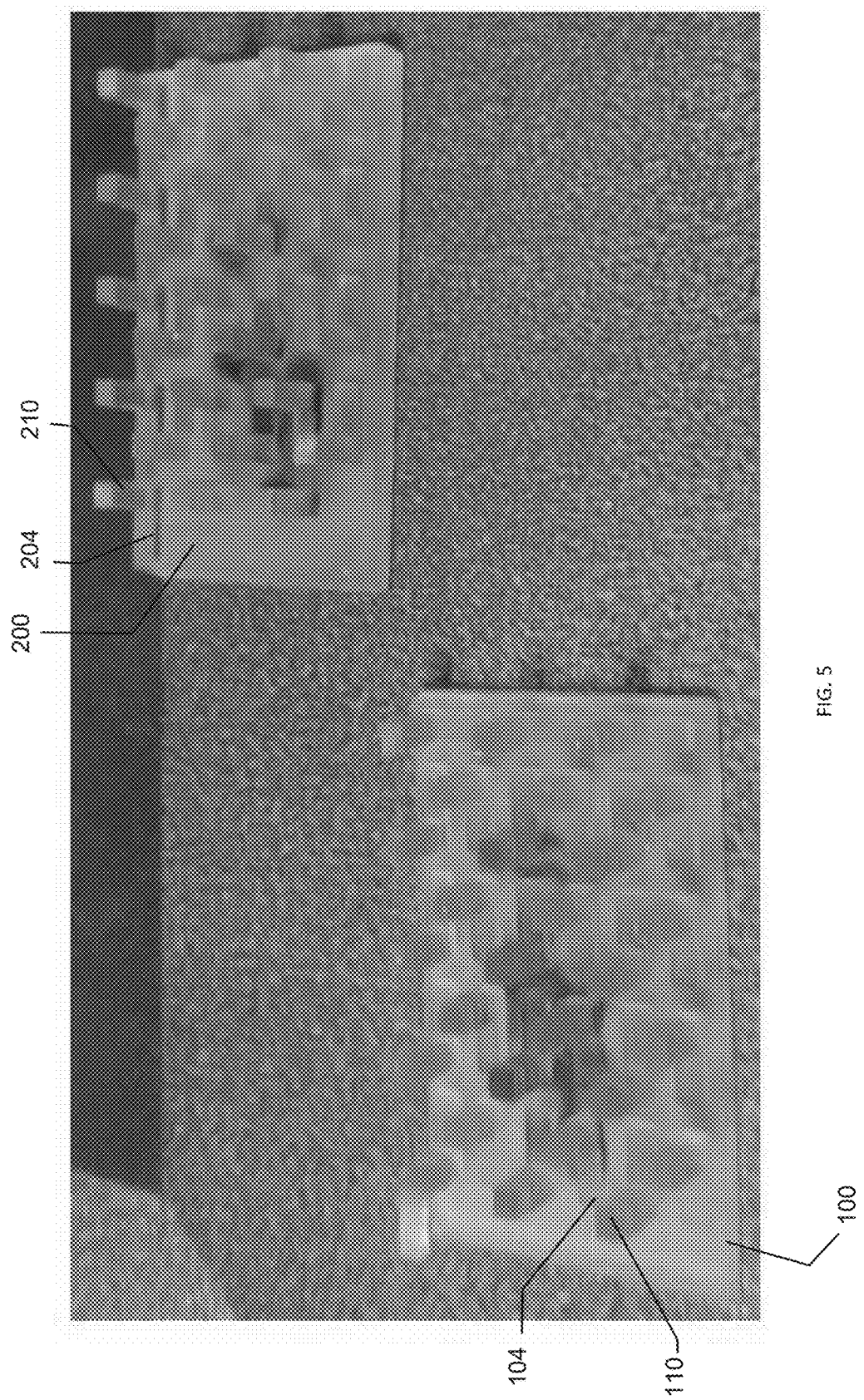
FIG. 5 is a Photograph of 3-D printed mock-ups of the separate n-type and p-type components, showing the regular arrays of 2×2 mm legs printed onto a mock-up of the substrate to form single n-type or p-type components.
Figure 6:
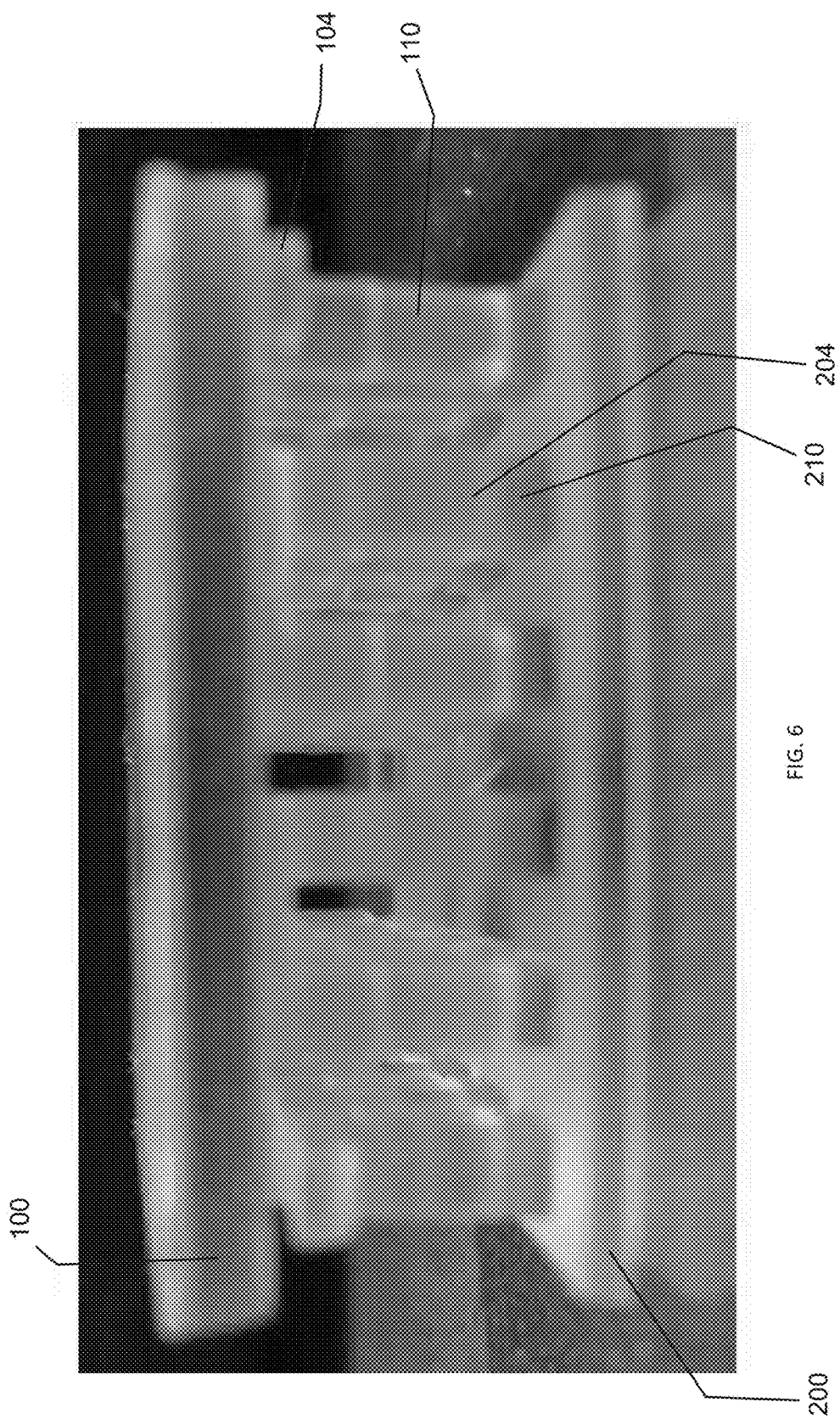
FIG. 6 is an elevation view of the assembled 3-D printed thermoelectric generator, comprising mock-ups of the n-type and p-type components together with simulated substrate layers on the outer edges.
Figure 7:
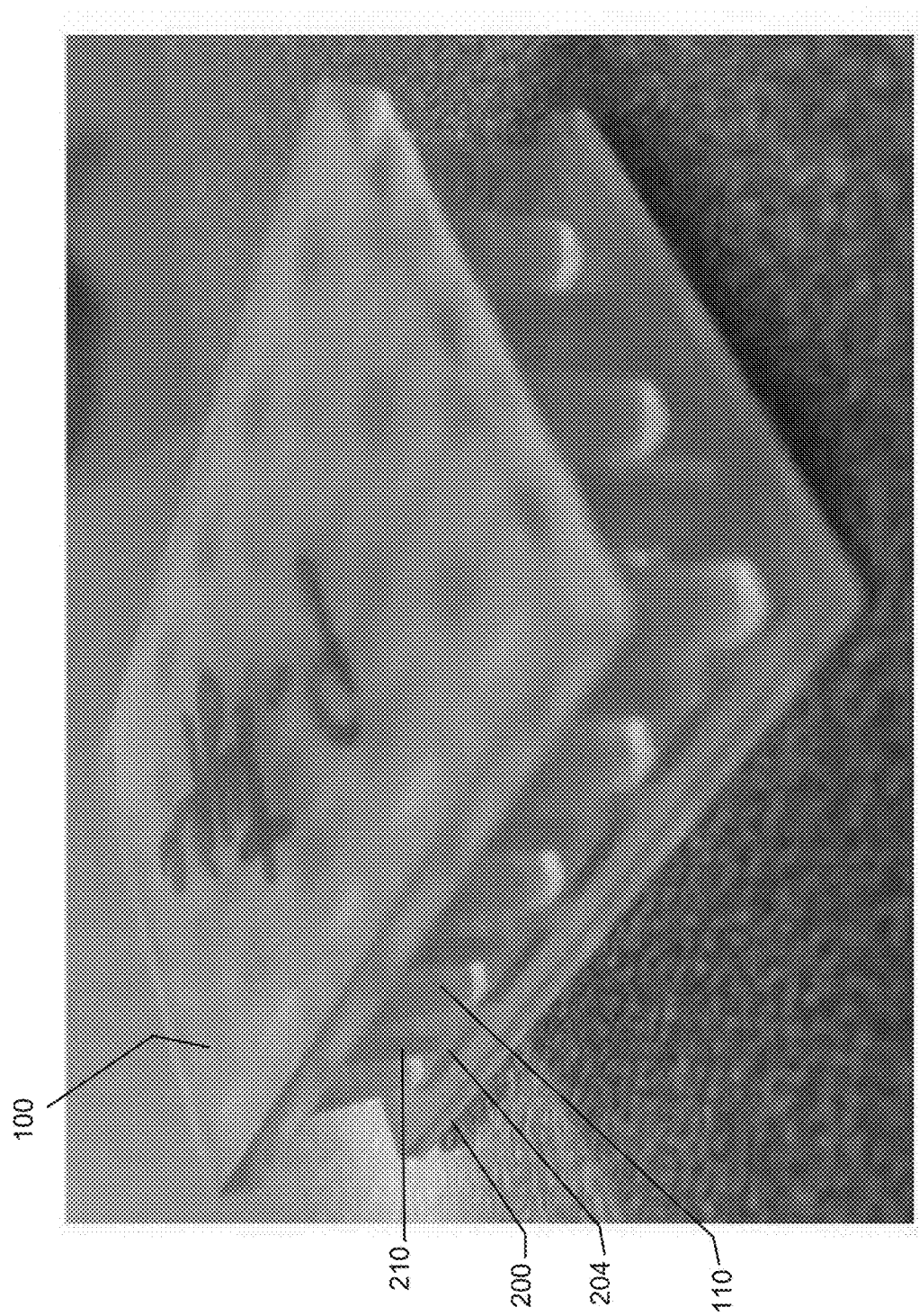
FIG. 7 is a perspective view of the assembled 3-D printed thermoelectric generator mock-up showing the full array of 9×6 legs sandwiched between the outer substrate layers and linked together by the top (thermal) and bottom (electrical) interconnects. The external electrical contacts are shown in the foreground at the bottom of the thermoelectric generator.
Figure 8:
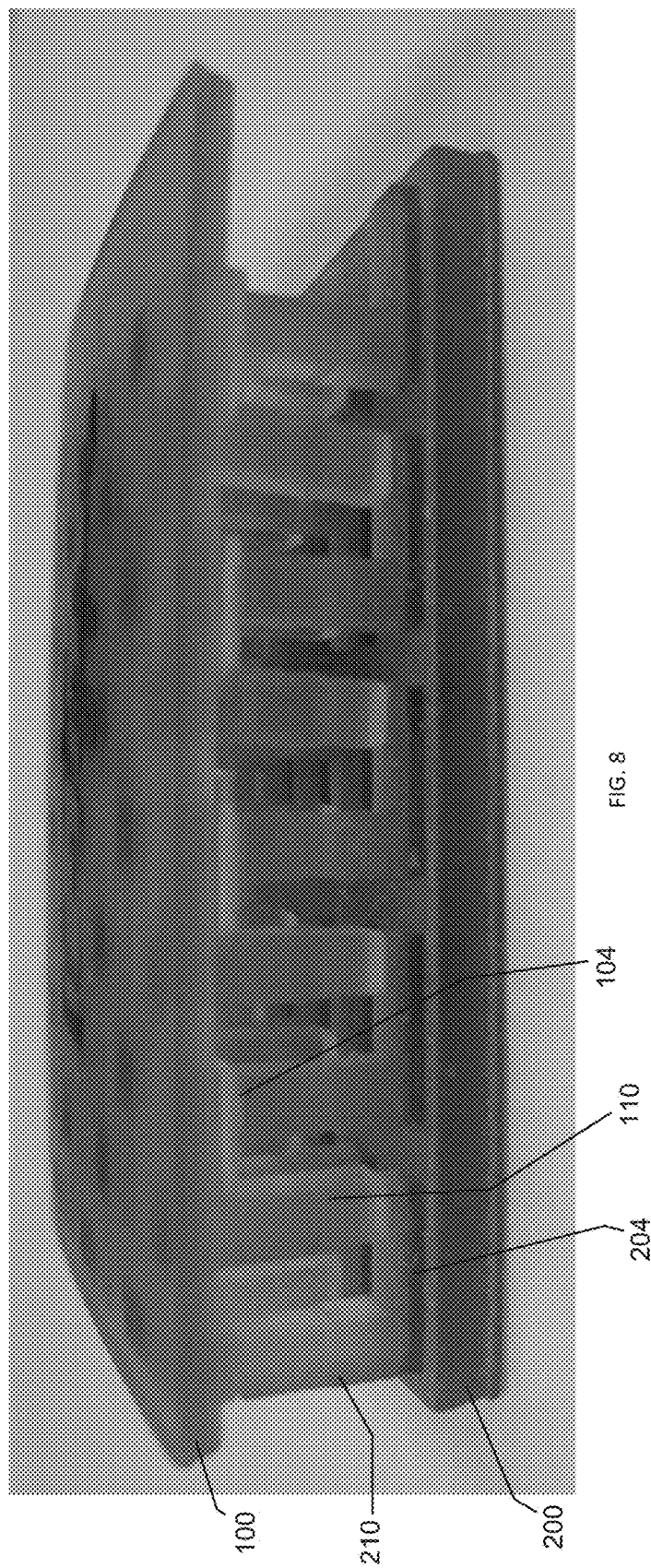
FIG. 8 is a perspective view of the assembled 3-D printed thermoelectric generator mock-up showing the full array of 9×6 legs sandwiched between the outer substrate layers and linked together by the top (thermal) and bottom (electrical) interconnects. The external electrical contacts are shown at bottom right on the thermoelectric generator.
Figure 9:
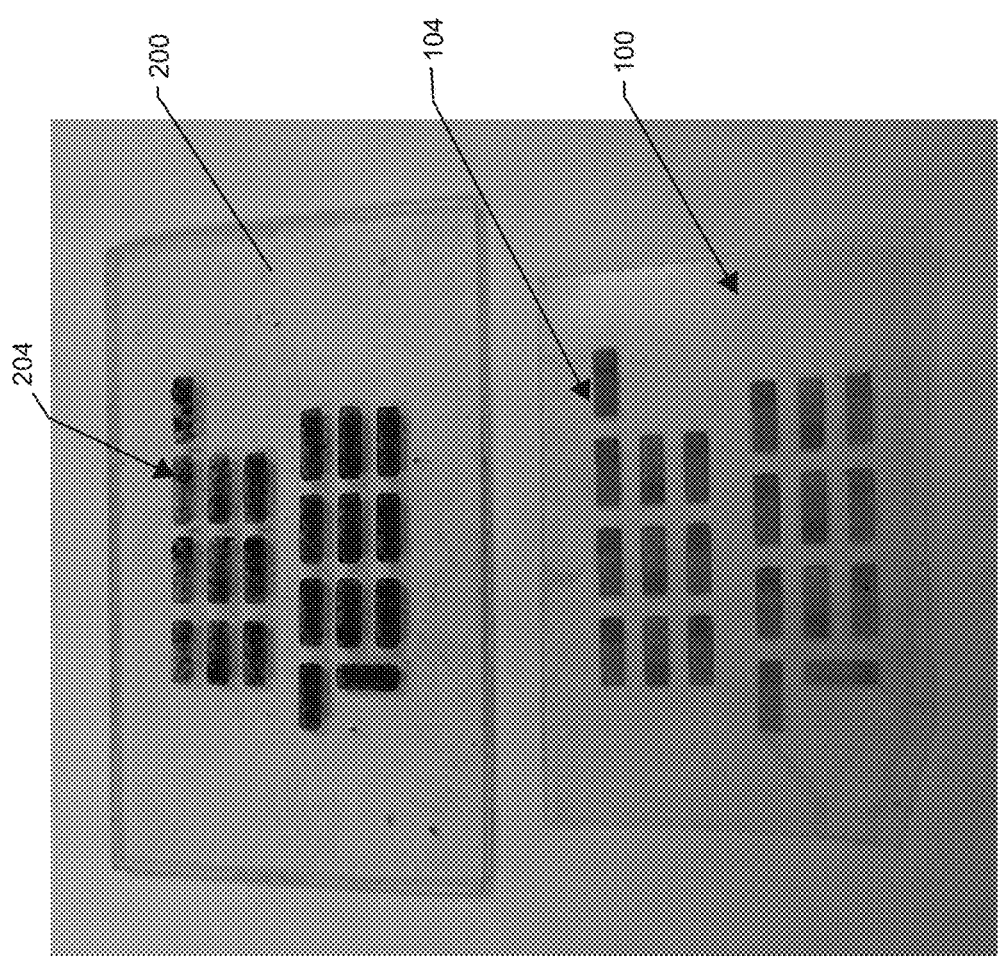
FIG. 9 is a Photograph of electrically-conducting prototypes of the n-type and p-type components of a 6×6 leg thermoelectric generator 3-D printed onto a flexible PDMS substrate.

Illustrative embodiments are now described. Other embodiments may be used in addition or instead. Details that may be apparent or unnecessary may be omitted to save space or to achieve a more effective presentation. Some embodiments may be practiced with additional components or steps and/or without all of the components or steps that are described.

This disclosure is illustrated by the following examples that are not to be construed as limiting the disclosure in scope to the specific procedures or products described in them.

This disclosure relates to the fabrication of devices useful for the generation of electrical power from waste heat or modest differences in temperature. This disclosure also relates to the additive manufacture of devices useful for generating electrical power. This disclosure also relates to the 3-D printing of devices useful for generating electrical power.

EXAMPLE 1

In one embodiment, a sheet of the non-conducting polyimide Kapton® substrate 100 of the appropriate thickness was affixed to the build plate of a commercial stereolithographic printer (Ember from Autodesk, San Francisco, Calif.). An electrically-conducting photopolymer resin was prepared by mixing together about 65% to about 75% of Photomer 4050 (PEG 200 diacrylate, IGM Resins, St. Charles, Ill.), about 15% to about 25% of SR494 from Sartomer Americas (ethoxylated pentaerythritol tetraacrylate, Exton, Pa.), about 2.0 weight % of BAPO (phenylbis (2,4,6-trimethylbenzoyl)phosphine oxide), IGM Resins, Charlotte, N.C.), and about 40 mg of single-walled carbon nanotubes (SWCNT) obtained from OCSiAl (Palo Alto, Calif.), and doped with p-type material to obtain about 50 mL of an electrically-conducting p-type photocurable resin. Preferably, Photomer 4050 is about 73% of the total resin. The resin was dispersed by power sonication with a Branson (Danbury, Conn.) Digital Sonifier model 250 fitted with a model 102C probe followed by agitation using a magnetic stirrer. The electrically-conducting p-type photocurable resin was placed in the build vat of the Ember printer and a 6×6 array 102 of 2 mm×2 mm legs 110 with 0.5 mm heights on 2 mm×5 mm interconnects 104 was printed onto the non-conducting Kapton substrate 100 to produce the p-type component. The array 102 comprises a series of interconnects 104 spaced apart from each other. Each interconnect has a first end 106 and a second end 108 opposite the first end 106. Stemming away from the first end 106 is the leg 110. The leg 110 comprises a proximal end 112 and a distal end 114. The proximal end 112 is operatively connected to the first end 106 of the interconnect 104.

Separately, a similar electrically-conducting resin was prepared as described above and doped with n-type material to obtain about 50 mL of a separate electrically-conducting n-type photocurable resin, which was similarly dispersed by power sonication with a Branson (Danbury, Conn.) Digital Sonifier model 250 fitted with a model 102C probe followed by agitation using a magnetic stirrer. The p-type photocurable resin was removed from the Ember printer and the electrically-conducting n-type photocurable resin was placed in the build vat of the Ember printer. Another sheet of the non-conducting Kapton® substrate 200 of the appropriate thickness was affixed to the build plate of the Ember printer, and a 6×6 array 202 of 2 mm×2 mm legs 210 with 0.5 mm heights on 2 mm×5 mm interconnects 204 was printed onto the non-conducting Kapton® substrate 200 to produce the n-type component. The array 202 comprises a series of interconnects 204 spaced apart from each other. Each interconnect has a first end 206 and a second end 208 opposite the first end 206. Stemming away from the first end 206 is the leg 210. The leg comprises a proximal end 212 and a distal end 214. The proximal end 212 is operatively connected to the first end 206 of the interconnect 204.

The p-type and n-type components were then removed from their respective build plates, washed with isopropanol and water to remove unreacted resin components, and then exposed to additional irradiation by light with a significant 405 nm component to complete the polymerization process, in a manner which is well-known to one skilled in the art. Both pieces were then treated with (e.g. coated with, dipped into, or painted with) electrically-conducting liquid or paste known in the trade as potting paste, which is available at sources familiar to those skilled in the art, in order to form good electrical contact between the components. The coating or dipping process is accomplished in such a way that just the free distal ends 114, 214 of the thermoelectric legs 110, 210 were wetted, after which the un-type and p-type components were fitted together to form the completed thermoelectric device supported on a flexible Kapton® substrate. Preferably, the array of p-type components 102 is assembled with the array of n-type components 202 such that the distal ends 114 of the p-type legs 110 are operatively connected to a respective second end 208 of the second set of n-type interconnects 204, and the distal ends 214 of the n-type legs 210 are operatively connected to a respective second end 108 of the first set of p-type interconnects 104 to form a thermoelectric generator. The device can optionally be fitted into a larger enclosure or left as is, with the Kapton® pieces optionally trimmed to fit the intended space. The device can then be filled with a suitable non-conducting substance, or left filled with air, or a vacuum can be pulled on the device in order to electrically insulate it. The resulting thermoelectric generator can then be used in a wide variety of applications.

EXAMPLE 2

In another embodiment, a prototype thermoelectric generator was fabricated by first preparing an electrically non-conducting acrylate resin by mixing together about 65% to about 75% of Photomer 4050 (PEG 200 diacrylate, IGM Resins, St. Charles, Ill.), about 15% to about 25% of SR494 from Sartomer Americas (ethoxylated pentaerythritol tetraacrylate, Exton, Pa.), about 2.0 weight % of BAPO (phenylbis(2,4,6-trimethylbenzoyl)phosphine oxide), IGM Resins, Charlotte, N.C.), and agitated for 24 hours using a magnetic stirrer to obtain about 50 mL of resin. Preferably, the Photomer is about 73% of the total resin. The non-conducting substrate layer 100 of an arbitrary size was printed onto the build plate of a commercial stereolithographic printer (Ember from Autodesk, San Francisco, Calif.). An electrically-conducting photopolymer resin was prepared by mixing together about 65% to about 750% of Photomer 4050 (PEG 200 diacrylate, IGM Resins, St. Charles, Ill.), about 15% to about 25% of SR494 from Sartomer Americas (ethoxylated pentaerythritol tetraacrylate, Exton, Pa.), about 2.0 weight % of BAPO (phenylbis (2,4,6-trimethylbenzoyl)phosphine oxide), IGM Resins, Charlotte, N.C.), and about 40 mg of single-walled carbon nanotubes (SWCNT) obtained from OCSiAl (Palo Alto, Calif.), and doped with p-type material to obtain about 50 mL of a separate electrically-conducting p-type photocurable resin. Preferably, the Photomer is about 73% of the total resin. The resin was dispersed by power sonication with a Branson (Danbury, Conn.) Digital Sonifier model 250 fitted with a model 102C probe followed by agitation using a magnetic stirrer. The electrically-conducting p-type photocurable resin was placed in the build vat of a commercial stereolithographic printer (Ember from Autodesk, San Francisco, Calif.) and printed onto the non-conducting acrylate substrate 100 to produce a p-type component comprising 6×6 arrays 102 of 2 mm×2 mm legs 110 with 0.5 mm heights on 2 mm×5 mm interconnects 104 printed onto the non-conducting acrylate substrate 100 as in Example 1.

Separately, a similar electrically-conducting resin was prepared and doped with n-type material to obtain about 50 mL of a separate electrically-conducting n-type photocurable resin, which was similarly dispersed by power sonication with a Branson (Danbury, Conn.) Digital Sonifier model 250 fitted with a model 102C probe followed by agitation using a magnetic stirrer. The electrically-conducting n-type photocurable resin was placed in the build vat of a commercial stereolithographic printer (Ember from Autodesk, San Francisco, Calif.) and printed onto the non-conducting acrylate substrate 200 to produce an n-type component comprising 6×6 arrays 202 of 2 mm×2 mm legs 210 with 0.5 mm heights on 2 mm×5 mm interconnects 204 printed onto the non-conducting acrylate substrate 200 as in Example 1. The p-type and n-type components were then removed from their respective build plates, post-processed, and assembled as described in Example 1 to obtain the thermoelectric device supported on a flexible acrylate substrate 100, 200.

EXAMPLE 3

In another embodiment, a prototype thermoelectric generator was fabricated by first preparing an electrically non-conducting photopolymer resin by mixing together about 65% to about 75% of Photomer 4050 (PEG 200 diacrylate, IGM Resins, St. Charles, Ill.), about 15% to about 25% of SR494 from Sartomer Americas (ethoxylated pentaerythritol tetraacrylate, Exton, Pa.), about 2.0 weight % of BAPO (phenylbis(2,4,6-trimethylbenzoyl)phosphine oxide), IGM Resins, Charlotte, N.C.), and agitated for 24 hours using a magnetic stirrer to obtain about 50 mL of resin. Preferably, the Photomer was about 73% of the total resin. The non-conducting substrate layer 100 of an arbitrary size was printed onto the build plate of a commercial stereolithographic printer (Ember from Autodesk, San Francisco, Calif.). An electrically-conducting photopolymer resin was prepared by mixing together about 65% to about 75% of Photomer 4050 (PEG 200 diacrylate, IGM Resins, St. Charles, Ill.), about 15% to about 25% of SR494 from Sartomer Americas (ethoxylated pentaerythritol tetraacrylate, Exton, Pa.), about 2.0 weight % of BAPO (phenylbis (2,4,6-trimethylbenzoyl)phosphine oxide), IGM Resins, Charlotte, N.C.), and about 40 mg of single-walled carbon nanotubes (SWCNT) obtained from OCSiAl (Palo Alto, Calif.), to obtain about 50 mL of resin. Preferably, the Photomer was about 73% of the total resin. The resin was dispersed by power sonication with a Branson (Danbury, Conn.) Digital Sonifier model 250 fitted with a model 102C probe followed by agitation using a magnetic stirrer. The combined mixture was placed in the build vat of a commercial stereolithographic printer (Ember from Autodesk, San Francisco, Calif.) and a 6×6 pattern of 2 mm×5 mm interconnects 104 was printed onto the non-conducting acrylate substrate 100 to produce a non-doped, electrically-conducting interconnect layer for the p-type component. A second electrically-conducting resin was prepared as described above and doped with p-type material to obtain a separate electrically-conducting p-type photocurable resin. The original, non-doped photocurable resin was removed from the Ember printer and the p-type photocurable resin was placed in a vat on the Ember printer. A 6×6 array of 2 mm×2 mm p-type legs 110 with a height of 0.5 mm was then printed onto the non-doped 2 mm×5 mm interconnects 104 to complete the p-type array 102, which was then removed from the Ember printer and washed and post-processed as described in Example 1. A fresh layer of the original non-conducting acrylate resin was then printed onto a fresh build plate of the Ember printer to provide a new non-conducting substrate 200. The non-conducting acrylate resin was removed from the Ember vat, and the original non-doped electrically-conducting resin was placed in a vat on the Ember and used to print a 6×6 pattern of 2 mm×5 mm interconnects 204 onto the fresh non-conducting acrylate substrate 200 to produce a non-doped, electrically-conducting interconnect layer for the n-type component. A third electrically-conducting photocurable resin was prepared as described above and doped with n-type material to obtain a separate electrically-conducting n-type photocurable resin. The original, non-doped electrically-conducting photocurable resin was removed from the Ember printer and the n-type photocurable resin was placed in a vat on the Ember printer. A 6×6 array of 2 mm×2 mm n-type legs 210 with a height of 0.5 mm was then printed onto the non-doped 2 mm×5 mm interconnects 204 to complete the n-type array 202, which was then removed from the Ember printer and washed and post-processed as described in Example 1. The p-type and n-type components were then assembled as described in Example 1 to obtain the thermoelectric device without doped interconnects and supported on a flexible acrylate substrate.

EXAMPLE 4

In another embodiment, a prototype thermoelectric generator was fabricated by first preparing an electrically non-conducting polydimethylsilane substrate by mixing Sylgard 184 Silicone Elastomer Kit Base and Curing Agent (Dow Corning, Midland, Mich.) in a 10:1 (w/w) ratio, respectively, casting the mixture into a 2.4 cm×4.0 cm mold, and then curing the mixture by heating it at 75° for 120 minutes to obtain a solid non-conducting PDSM substrate 100. An electrically-conducting photopolymer resin was then prepared by mixing together about 65% to about 75% of Photomer 4050 (PEG 200 diacrylate, IGM Resins, St. Charles, Ill.), about 15% to about 25% of SR494 from Sartomer Americas (ethoxylated pentaerythritol tetraacrylate, Exton, Pa.), about 2.0 weight % of BAPO (phenylbis (2,4,6-trimethylbenzoyl)phosphine oxide), IGM Resins, Charlotte, N.C.), and about 40 mg of single-walled carbon nanotubes (SWCNT) obtained from OCSiAl (Palo Alto, Calif.), to obtain about 50 mL of resin. Preferably, the Photomer was about 73% of the total resin. The resin was dispersed by power sonication with a Branson (Danbury, Conn.) Digital Sonifier model 250 fitted with a model 102C probe followed by agitation using a magnetic stirrer. A second mold with a height of 0.5 mm was placed over the top of the base mold and the undoped, electrically-conducting resin was spread into the cavities of the second mold to form a 6×6 pattern of 2 mm×5 mm interconnects 104 on the non-conducting PDMS substrate 100. The mold assembly was exposed to sunlight for 3 minutes to further cure the resin and then a third mold with a height of 0.5 mm was placed on top of the two previous molds. A second electrically-conducting resin was prepared and doped with p-type material as described in Example 3 to obtain an electrically-conducting p-type photocurable resin. The p-type photocurable resin was spread into the cavities of the third mold to form a 6×6 pattern of p-type legs 110 on top of the non-doped, electrically-conducting second (interconnect) layer 104 to form a p-type array 102 as in Example 1. Separately, another 2.4 cm×4.0 cm electrically non-conducting polydimethylsilane substrate was formed inside a base mold and cured by heating the silicone mixture at 750 for 120 minutes to obtain a non-conducting substrate 200. A second n-type mold was placed over the base mold and the undoped electrically-conducting resin was applied to the mold to create the 6×6 pattern of 2 mm×5 mm interconnects 204 on the non-conducting PDMS layer. A third electrically-conducting resin was prepared and doped with n-type material as described in Example 3 to obtain an electrically-conducting n-type photocurable resin. A third n-type mold was placed over the second mold and the n-type photocurable resin was spread into the cavities of the third mold to form a 6×6 pattern of n-type legs 210 on top of the non-doped, electrically-conducting second (interconnect) layer 204 to form an n-type array as in Example 1. After washing and post-curing, both the p-type and n-type components were removed from their respective molds and washed and post-processed as described in Example 1. The p-type and n-type components were then assembled as described in Example 1 to obtain the molded thermoelectric device supported on a flexible acrylate substrate.

All articles, patents, patent applications, and other publications that have been cited in this disclosure are incorporated herein by reference.

The phrase "means for" when used in a feature is intended to and should be interpreted to embrace the corresponding structures and materials that have been described and their equivalents. Similarly, the phrase "step for" when used in a feature is intended to and should be interpreted to embrace the corresponding acts that have been described and their equivalents. The absence of these phrases from a feature means that the feature is not intended to and should not be interpreted to be limited to these corresponding structures, materials, or acts, or to their equivalents.

Relational terms such as "first" and "second" and the like may be used solely to distinguish one entity or action from another, without necessarily requiring or implying any actual relationship or order between them. The terms "comprises," "comprising," and any other variation thereof when used in connection with a list of elements in the specification or features are intended to indicate that the list is not exclusive and that other elements may be included. Similarly, an element preceded by an "a" or an "an" does not, without further constraints, preclude the existence of additional elements of the identical type.

The abstract is provided to help the reader quickly ascertain the nature of the technical disclosure. It is submitted with the understanding that it will not be used to interpret or limit the scope. In addition, various features in the foregoing detailed description are grouped together in various embodiments to streamline the disclosure.

What is claimed is:

1. A method of fabricating a thermoelectric device, comprising:
  a. operatively connecting a first set of interconnects with respective p-type legs to form an array of p-type components, the first set of interconnects comprising a plurality of interconnects, each interconnect comprising a first end and a second end opposite the first end, each p-type leg comprising a proximal end and a distal end, wherein the proximal end of each p-type leg is operatively connected to the first end of the respective interconnect of the first set of interconnects;
  b. operatively connecting a second set of interconnects with respective n-type legs to form an array of n-type components, the second set of interconnects comprising a plurality of interconnects, each interconnect comprising a first end and a second end opposite the first end, each n-type leg comprising a proximal end and a distal end, wherein the proximal end of each n-type leg is operatively connected to the first end of the respective interconnect of the second set of interconnects;
  c. operatively connecting the array of p-type components to a first non-conducting substrate;
  d. operatively connecting the array of n-type components to a second non-conducting substrate; and
  e. assembling the array of p-type components with the array of n-type components to form a thermoelectric generator wherein the distal ends of the p-type legs are directly connected to a respective second end of the second set of interconnects, and the distal ends of the n-type legs are directly connected to a respective second end of the first set of interconnects to form a thermoelectric generator.

2. The method of claim 1, further comprising enclosing the thermoelectric generator in a container.

3. The method of claim 1, wherein the first and second sets of interconnects and the p-type and n-type legs are produced by additive manufacturing.

4. The method of claim 3, wherein the additive manufacturing is selected from the group consisting of 3-D printing, stereolithography, fused-deposition modeling, and inkjet printing.

5. The method of claim 1, wherein the first and second sets of interconnects and the p-type and n-type legs are produced by casting.

6. The method of claim 1, wherein an orientation of printing direction is modified in order to optimize specific properties of the thermoelectric generator.

7. The method of claim 1, wherein the distal ends of the p-type legs and the n-type legs are treated with electrically-conducting liquid.

8. The method of claim 1, wherein the first and second non-conducting substrates each comprises PEG 200 diacrylate; ethoxylated pentaerythritol tetraacrylate, phenylbis(2,4,6-trimethylbenzoyl)phosphine oxide.

9. A method of fabricating a thermoelectric device, comprising:
   a. operatively connecting an array of p-type components to a first non-conducting substrate;
   b. operatively connecting an array of n-type components to a second non-conducting substrate; and
   c. stacking the array of p-type components with the array of n-type components to form a thermoelectric generator, wherein the array of p-type components comprises a first set of interconnects operatively connected to respective p-type legs to form the array of p-type components, the first set of interconnects comprising a plurality of interconnects, each interconnect comprising a first end and a second end opposite the first end, each p-type leg comprising a proximal end and a distal end, wherein the proximal end of each p-type leg is operatively connected to the first end of the respective interconnect of the first set of interconnects; and wherein the array of n-type components comprises a second set of interconnects operatively connected to respective n-type legs to form the array of n-type components, the second set of interconnects comprising a plurality of interconnects, each interconnect comprising a first end and a second end opposite the first end, each n-type leg comprising a proximal end and a distal end, wherein the proximal end of each n-type leg is operatively connected to the first end of the respective interconnect of the second set of interconnects.

10. The method of claim 9, wherein the distal ends of the p-type legs are operatively connected to a respective second end of the second set of interconnects, and the distal ends of the n-type legs are operatively connected to a respective second end of the first set of interconnects to form a thermoelectric generator.

11. The method of claim 9, wherein the first and second sets of interconnects and the p-type and n-type legs are produced by additive manufacturing.

12. The method of claim 11, wherein the additive manufacturing is selected from the group consisting of 3-D printing, stereolithography, fused-deposition modeling, and inkjet printing.

13. The method of claim 9, wherein the first and second sets of interconnects and the p-type and n-type legs are produced by casting.

14. The method of claim 9, wherein an orientation of printing direction is modified in order to optimize specific properties of the thermoelectric generator.

15. The method of claim 9, wherein the distal ends of the p-type legs and the n-type legs are treated with electrically-conducting liquid.

16. The method of claim 9, wherein the first and second non-conducting substrates each comprises PEG 200 diacrylate.

17. The method of claim 9, wherein the first and second non-conducting substrates each comprises ethoxylated pentaerythritol tetraacrylate.

18. The method of claim 9, wherein the first and second non-conducting substrates each comprises phenylbis(2,4,6-trimethylbenzoyl)phosphine oxide.

* * * * *